US007372338B2

(12) United States Patent
Tseng

(10) Patent No.: US 7,372,338 B2
(45) Date of Patent: May 13, 2008

(54) SELF-ADJUSTING CLOCK GENERATOR WITH STABLE FREQUENCY OUTPUT

(75) Inventor: Chien Chung Tseng, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 95 days.

(21) Appl. No.: 11/218,806

(22) Filed: Sep. 2, 2005

(65) Prior Publication Data

US 2007/0052486 A1 Mar. 8, 2007

(51) Int. Cl.
*H03L 7/00* (2006.01)

(52) U.S. Cl. ......................... 331/16; 331/1 R; 327/102

(58) Field of Classification Search ................ 331/183, 331/1 R, 16; 327/102
See application file for complete search history.

(56) References Cited

U.S. PATENT DOCUMENTS 3,466,526 A * 9/1969 Cole .......................... 327/102
3,824,410 A * 7/1974 Funaki et al. ............... 327/102
5,212,459 A * 5/1993 Ueda et al. ................. 331/111
6,281,495 B1 * 8/2001 Kitamura .................... 250/306
6,509,802 B2 * 1/2003 Kasperkovitz ............... 331/25

OTHER PUBLICATIONS

R. Achenbach et al., "A Digitally Temperature-Compensated Crystal Oscillator," *IEEE J. of Solid-State Circuits*, vol. 35, No. 10 (Oct. 2000), pp. 1502-1506.

* cited by examiner

*Primary Examiner*—Benny Lee
*Assistant Examiner*—Levi Gannon
(74) *Attorney, Agent, or Firm*—Stout, Uxa, Buyan & Mullins, LLP

(57) ABSTRACT

A self-adjusting clock generator is disclosed. The self-adjusting clock generator comprises a voltage control oscillator for generating a frequency output, a frequency to voltage converter for converting the frequency output into a voltage output, and a comparator for comparing the voltage output with a reference voltage in order to produce a comparison voltage. The produced comparison voltage is provided as feedback to the voltage control oscillator such that the frequency output generated by the voltage control oscillator is adjusted, based on the comparison voltage, to converge into a stable frequency output.

19 Claims, 3 Drawing Sheets

100
Coarse VCO
Frequency to voltage converter
High gain comparator
Bandgap reference circuit
150 160 170 180 110 120 130 140

120
Vcc
Vbb
$P_1$ $P_2$ $N_2$
$V_{in}$
$N_3$ $N_4$ $V_{out}$
$N_1$ $C_1$ $C_2$
121

SELF-ADJUSTING CLOCK GENERATOR WITH STABLE FREQUENCY OUTPUT

BACKGROUND

1. Field of the Invention

The present invention relates generally to integrated circuits, and more particularly, to clock generator circuitry that is capable of generating a stable frequency output under various conditions and a method for producing the stable frequency output.

2. Description of the Related Art

An accurate clock generator is an essential component of an integrated circuit. Although varieties of clock generators are available, such as RC-OSC or Ring-OSC, these clock generators suffer from high frequency drifts when the temperature, the supply voltage, and the production process vary.

To overcome the clock frequency drift problem, external crystals or oscillators have to be used as clock generators in order to supply stable clock frequencies to semiconductor chips. However, external clock generators not only occupy more circuit layout space, but also increase chip production cost.

In view of the foregoing, there is a need for a new clock generator that is capable of generating a stable frequency output under various conditions and is compatible with standard CMOS production process.

SUMMARY OF THE INVENTION

Broadly speaking, the present invention fills this need by providing a self-adjusting clock generator that is capable of producing a stable frequency output.

In accordance with one aspect of the present invention, a self-adjusting clock generator is provided. The self-adjusting clock generator comprises a voltage control oscillator for generating a frequency output. The generated frequency output is then compared with a reference voltage to produce a comparison voltage, which is provided as feedback to the voltage control oscillator such that the frequency output generated by the voltage control oscillator is adjusted to converge into a stable frequency output.

In accordance with another aspect of the present invention, a self-adjusting clock generator is disclosed. The self-adjusting clock generator comprises a voltage control oscillator for generating a frequency output, a frequency to voltage converter for converting the frequency output generated by the voltage control oscillator to a voltage output, a comparator for comparing the voltage output generated by the frequency to voltage converter with a reference voltage to produce a comparison voltage. The produced comparison voltage is then provided as feedback to the voltage control oscillator such that the frequency output generated by the voltage control oscillator is adjusted based on the comparison voltage to converge into a stable frequency output.

In accordance with yet another aspect of the present invention, a method for producing a stable frequency output by a self-adjusting clock generator is described. First, a frequency output is generated, and the generated frequency output is converted into a voltage output. Then, the converted voltage output is compared with a reference voltage to produce a comparison voltage. Based on the comparison voltage, the frequency output is adjusted. Repeating the converting, the comparing, and the adjusting until the frequency output is converged into a stable frequency output.

It is to be understood that the foregoing general description and the following detailed description are exemplary and explanatory only and are not restrictive of the invention, as claimed.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF THE EXEMPLARY EMBODIMENTS

Reference is made in detail to embodiments of the invention. While the invention is described in conjunction with the embodiments, the invention is not intended to be limited by these embodiments. On the contrary, the invention is intended to cover alternatives, modifications and equivalents, which may be included within the spirit and scope of the invention as defined by the appended claims. Furthermore, in the following detailed description of the invention, numerous specific details are set forth in order to provide a thorough understanding of the invention. However, as is obvious to one ordinarily skilled in the art, the invention may be practiced without these specific details. In other instances, well-known methods, procedures, components, and circuits have not been described in detail so that aspects of the invention will not be obscured.

Figure 1:
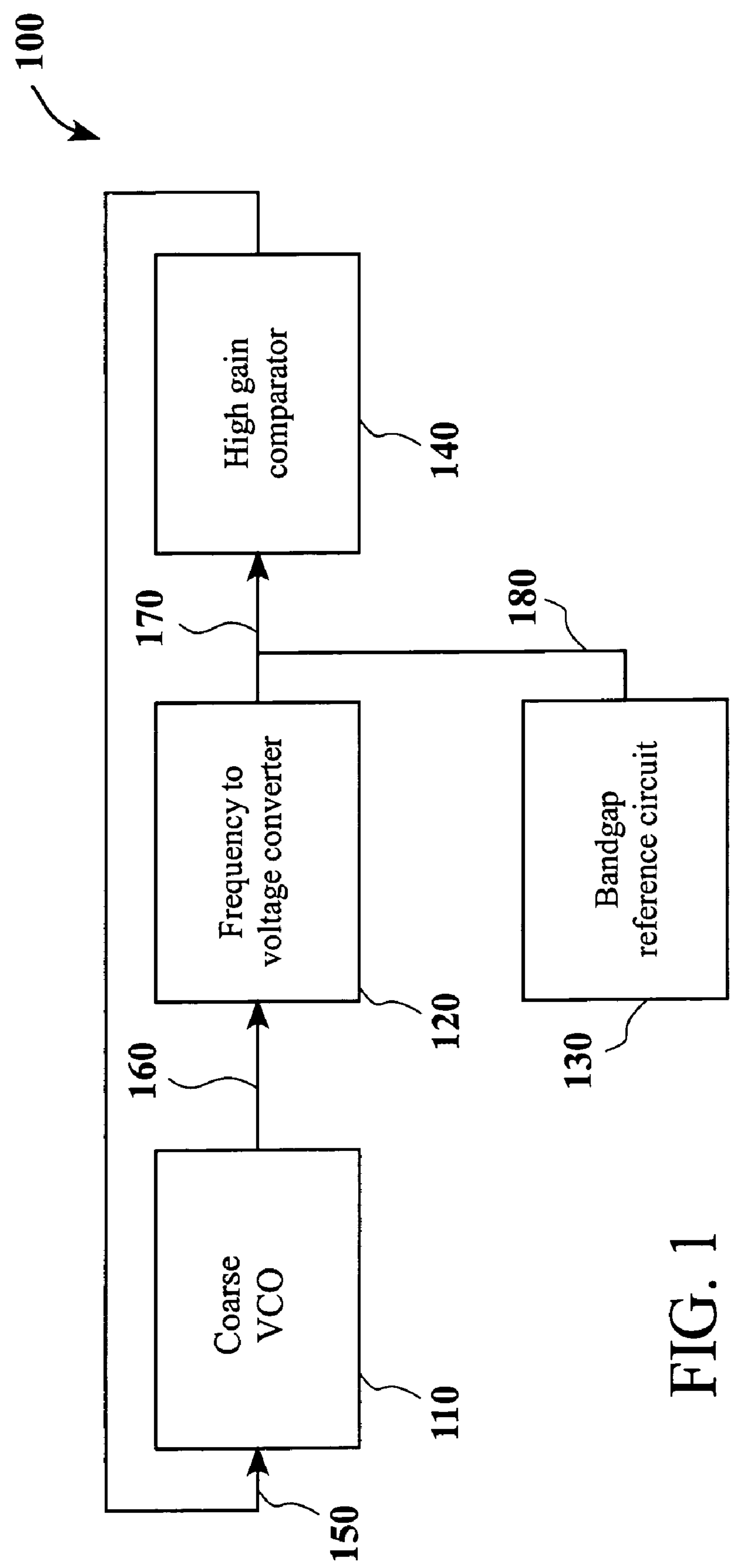
FIG. 1 shows a circuit block diagram for a self-adjusting clock generator with a stable frequency output in accordance with one embodiment of the present invention.

FIG. 1 shows a circuit block diagram for a self-adjusting clock generator 100 with a stable frequency output in accordance with one embodiment of the present invention. The self-adjusting clock generator 100 comprises a coarse voltage control oscillator (VCO) 110, a frequency to voltage converter 120, a bandgap reference circuit 130, and a high gain comparator 140. The output of the self-adjusting clock generator 100 is the frequency output 160.

The coarse VCO 110 inputs a comparison voltage 150, which is also the output of the high gain comparator 140. Initially, the coarse VCO 110 generates an approximate frequency output 160, which is in turn used as the input for the frequency to voltage converter 120. The frequency to voltage converter 120 converts the frequency output 160 generated by the coarse VCO 110 into a voltage output 170. After the high gain comparator 140 compares the voltage output 170, generated by the frequency to voltage converter 120, with the reference voltage 180, generated by the internal bandgap reference circuit 130, any slight difference between the voltage output 170 and the reference voltage 180 will be amplified by the high gain comparator 140. The result is to produce the comparison voltage 150, which is feedback to the coarse VCO 110 so that the coarse VCO 110 can adjust its frequency output 160 according to the comparison voltage 150. The voltage comparison and frequency adjustment processes will continue until the frequency output 160 is converged into a stable frequency output. In one embodiment, the stable frequency output generated by the self-adjusting clock generated varies less than 3% under various conditions.

Due to the feedback of the comparison voltage 150, whenever there is any external influence involved, such as the temperature, the supply voltage, and the production process variations, the self-adjusting clock generator 100 will automatically track its frequency output and dynamically adjust itself so that its frequency output will converge into a stable frequency output. If the frequency output 160 of the coarse VCO 110 drifts away from the required frequency, the drifted frequency output will be reflected in the voltage output 170 generated by the frequency to voltage converter 120. After the voltage output 170 is compared with the reference voltage 180, the high gain comparator 140 will output a comparison voltage 150 that reflects the voltage difference between the voltage output 170 and the reference voltage 180. Because the comparison voltage 150 is feedback to the coarse VCO 110 as a voltage input, the coarse VCO will correct the drift of the frequency output 160 according to the comparison voltage 150. Thus, the frequency output of the self-adjusting clock generator 100 will be self-adjusted to converge into the required frequency accordingly, regardless the temperature, the supply voltage, and the production process variations.

Figure 2:
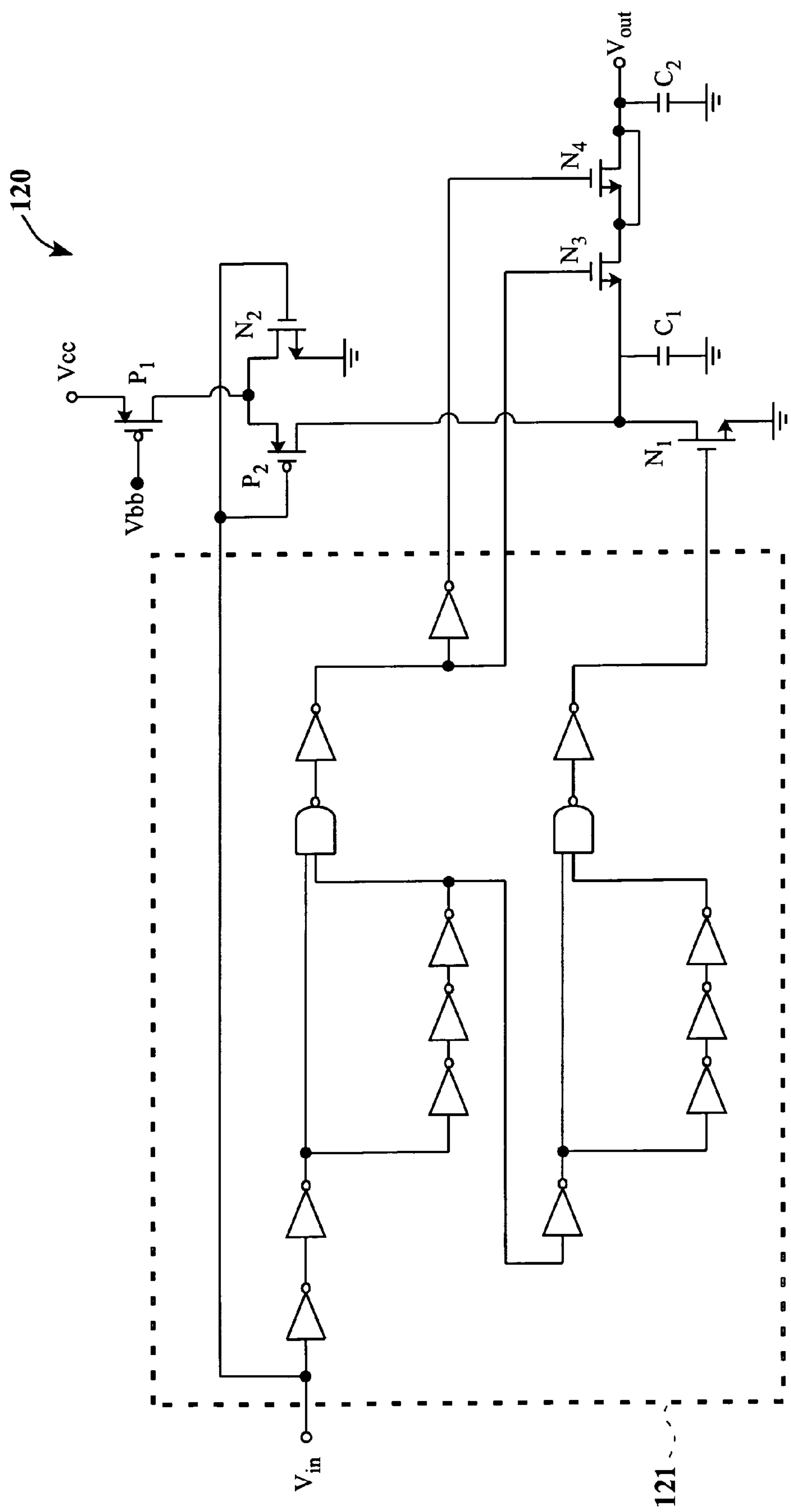
FIG. 2 shows a frequency to voltage converter in accordance with one embodiment of the present invention.

FIG. 2 shows the frequency to voltage converter 120 in accordance with one embodiment of the present invention. As shown, the frequency to voltage converter 120 comprises a clock cycle divider circuit 121, two P-channel transistors (P1 and P2), four N-channel transistors (N1, N2, N3, N4), and two capacitors (C1 and C2). As shown, the frequency to voltage converter 120 has a frequency input Vin and a voltage output Vout. As mentioned above, the frequency input Vin is the frequency output 160 generated by the coarse VCO 110, and the voltage output Vout is the voltage output 170 that is used as the input for the high gain comparator 140 in the self-adjusting clock generator 100.

The clock cycle divider circuit 121 comprises twelve inverters and two NAND gates. The clock cycle divider circuit 121 will divide each circuit clock cycle into three intervals: clock cycle interval one, clock cycle interval two, and clock cycle interval three. Transistor P1 functions as a current supply in the frequency to voltage converter 120.

During clock cycle interval one, transistor P2 is on, whereas transistors N1, N3, and N4 are off. The current supply P1 will charge capacitor C1 through transistor P2. During clock cycle interval two, transistors P2 and N1 are off, and transistors N3 and N4 are on. Thus, capacitor C1 is partially discharged and the discharge current will flow from capacitor C1 to capacitor C2 through transistors N3 and N4. The charged capacitor C2 results in a voltage output Vout. During clock cycle interval three, transistors P2, N3, and N4 are off, and transistor N1 is on. As a result, the remaining charge in capacitor C1 will be discharged through transistor N1 to the ground.

Figure 3:
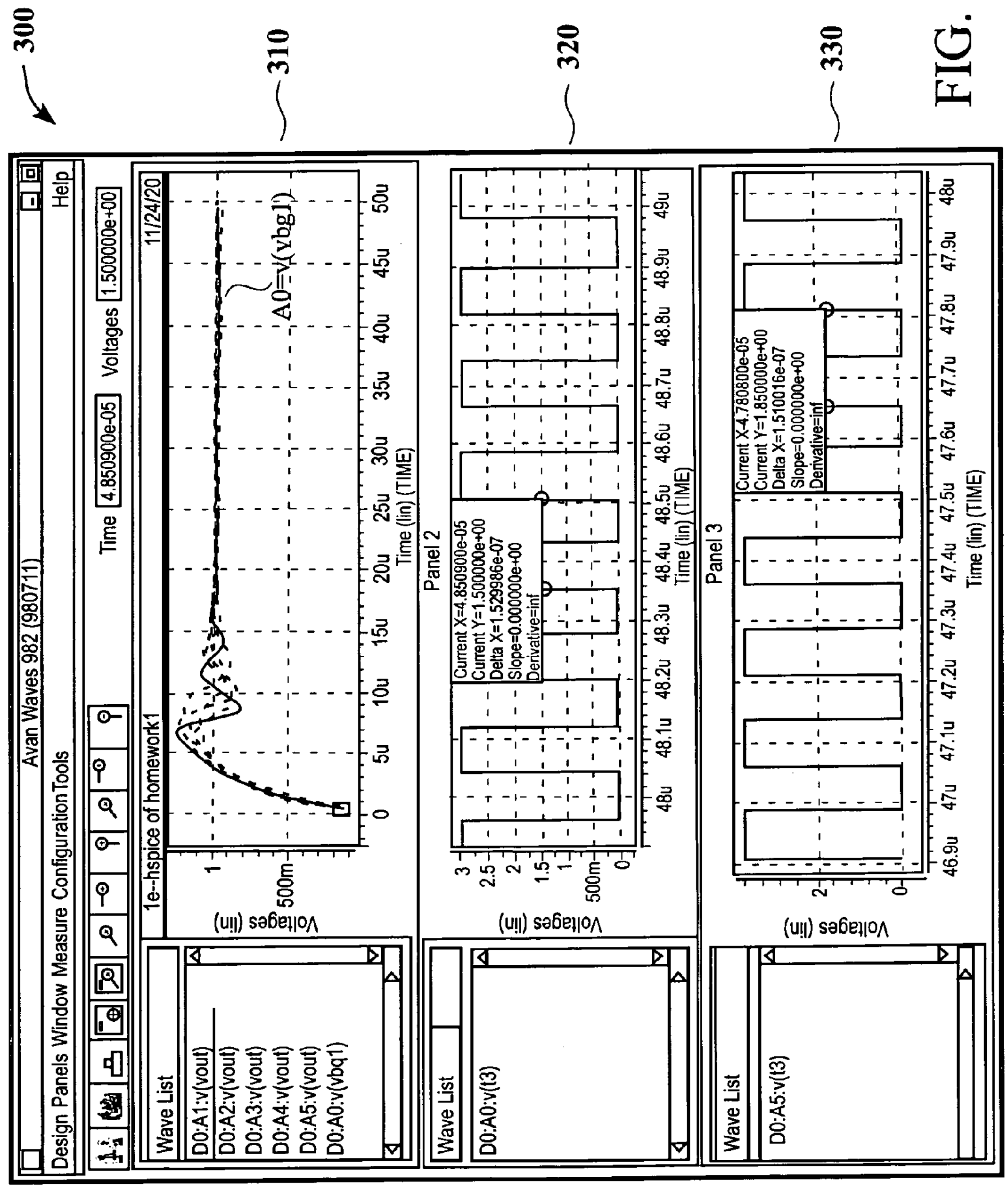
FIG. 3 shows a screen shot with three output diagrams generated by a self-adjusting clock generator in accordance with one embodiment of the present invention.

FIG. 3 shows a screen shot 300 with three output diagrams (310, 320, and 330) generated by a self-adjusting clock generator in accordance with one embodiment of the present invention.

The output diagram 310 comprises seven voltage output waveforms, wherein the first six waveforms A0, A1, . . . , A5 in the wave list column of the output diagram 310 represent the voltage outputs of a frequency to voltage converter in a self-adjusting clock generator under various test simulation conditions, such as various temperature, supply voltage, and process variations. The last waveform A0:v(vbg1) in the wave list column of the output diagram 310 represents the reference voltage generated by a bandgap reference circuit in the self-adjusting clock generator.

As shown, after the initial adjustments of the self-adjusting clock generator, these six voltage output waveforms A0, A1, . . . , A5 are converged into a stable voltage output which is the same as the reference voltage generated by the bandgap reference circuit in the self-adjusting clock generator.

The output diagrams 320 and 330 represent two frequency output waveforms under different test simulation conditions. As shown, the frequency output waveform in the output diagram 320 has a period (Delta X) of 1.529988e-07, whereas the frequency output waveform in the output diagram 330 has a period (Delta X) of 1.510016e-07. Therefore, the difference between these two frequency outputs are very close with less than 3% variation.

Overall, the claimed self-adjusting clock generator is capable of generating a stable frequency output under various temperature, supply voltage and process variations. The production process of the self-adjusting clock generator is compatible with the standard CMOS production process. The self-adjusting clock generator does not need any external passive elements or external crystals. Thus, the self-adjusting clock generator is capable of being implemented inside a semiconductor chip, supplying a stable and accurate clock frequency, which saves production cost and improves clock generator performance.

The foregoing descriptions of specific embodiments of the invention have been presented for purposes of illustration and description. They are not intended to be exhaustive or to limit the invention to the precise forms disclosed. Obviously, many modifications and variations are possible in light of the above teaching. The embodiments were chosen and described in order to explain the principles and the application of the invention, thereby enabling others skilled in the art to utilize the invention in its various embodiments and modifications according to the particular purpose contemplated. The scope of the invention is intended to be defined by the claims appended hereto and their equivalents.

What is claimed is:

1. A self-adjusting clock generator for producing a stable frequency output, comprising:

a voltage control oscillator for generating a frequency output;

a frequency to voltage converter for converting the frequency output to a voltage output, the frequency to voltage converter including:

a current supply circuit for supplying current;

a current control transistor for controllably passing the current from the current supply circuit according to the frequency output;

a first capacitor and a second capacitor;

a first transistor coupled to the first capacitor in parallel;

a second transistor coupled between the first capacitor and the second capacitor;

a clock cycle divider circuit for dividing the frequency output into three intervals defined by interval one, interval two, and interval three;

wherein the first capacitor is charged during the interval one; the second capacitor is charged by the first capacitor through the second transistor during the interval two; the first capacitor is completely discharged to ground through the first transistor while the current control transistor is off during the interval three, wherein the voltage output is compared with a reference voltage to produce a comparison voltage denoting drifted frequency of the frequency output, the comparison voltage is provided as feedback to a voltage input of the voltage control oscillator such that frequency of the frequency output generated by the voltage control oscillator is adjusted in accordance with the comparison voltage to converge into the stable frequency output.

2. The self-adjusting clock generator as recited in claim 1, wherein the self-adjusting clock generator, further comprising:

a high gain comparator that compares the voltage output generated by the frequency to voltage converter with the reference voltage to produce the comparison voltage.

3. The self-adjusting clock generator as recited in claim 1, wherein the self-adjusting clock generator, further comprising:

a bandgap reference circuit that generates the reference voltage.

4. The self-adjusting clock generator as recited in claim 1, wherein the stable frequency output generated by the self-adjusting clock generator varies less than about 3%.

5. The self-adjusting clock generator as recited in claim 1, wherein the clock cycle divider circuit comprises:

a plurality of first inverters for generating a first signal that has a non-inverted phase and a first delay corresponding to the frequency output;

a plurality of second inverters for generating a second signal that has an inverted phase and a second delay greater than the first delay corresponding to the frequency output;

at least one third inverter for generating a third signal that has a non-inverted phase and a third delay greater than the second delay corresponding to the frequency output;

a plurality of fourth inverters for generating a fourth signal that has an inverted phase and a fourth delay greater than the third delay corresponding to the frequency output;

a first AND logic circuit which receives the first signal and the second signal, and generates a first output to control the second transistor; and a second AND logic circuit which receives the third signal and the fourth signal, and generates a second output to control the first transistor.

6. A self-adjusting clock generator for producing a stable frequency output, comprising:

a voltage control oscillator for generating a frequency output;

a frequency to voltage converter for converting the frequency output to a voltage output, the frequency to voltage converter including:

a current supply circuit for supplying current;

a current control transistor for controllably passing the current from the current supply circuit according to the frequency output;

a first capacitor and a second capacitor;

a first transistor coupled to the first capacitor in parallel;

a second transistor coupled between the first capacitor and the second capacitor;

a clock cycle divider circuit for dividing the frequency output into three intervals defined by interval one, interval two, and interval three;

wherein the first capacitor is charged during the interval one; the second capacitor is charged by the first capacitor through the second transistor during the interval two; the first capacitor is completely discharged to ground through the first transistor while the current control transistor is off during the interval three; and a comparator for comparing the voltage output with a reference voltage to generate a comparison voltage denoting drifted frequency of the frequency output, wherein the comparison voltage is provided as feedback to the voltage control oscillator as a voltage input such that frequency of the frequency output generated by the voltage control oscillator is adjusted, based on the comparison voltage, to converge into the stable frequency output.

7. The self-adjusting clock generator as recited in claim 6, wherein the self-adjusting clock generator further comprises a bandgap reference circuit that is used to generate the reference voltage.

8. The self-adjusting clock generator as recited in claim 6, wherein the voltage control oscillator is a coarse voltage control oscillator.

9. The self-adjusting clock generator as recited in claim 6, wherein the comparator is a high gain comparator.

10. The self-adjusting clock generator as recited in claim 6, wherein the stable frequency output generated by the self-adjusting clock generator varies less than about 3%.

11. The self-adjusting clock generator as recited in claim 6, wherein the clock cycle divider circuit comprises:

a plurality of first inverters for generating a first signal that has a non-inverted phase and a first delay corresponding to the frequency output;

a plurality of second inverters for generating a second signal that has an inverted phase and a second delay greater than the first delay corresponding to the frequency output;

at least one third inverter for generating a third signal that has a non-inverted phase and a third delay greater than the second delay corresponding to the frequency output;

a plurality of fourth inverters for generating a fourth signal that has an inverted phase and a fourth delay greater than the third delay corresponding to the frequency output;

a first AND logic circuit which receives the first signal and the second signal, and generates a first output to control the second transistor; and a second AND logic circuit which receives the third signal and the fourth signal, and generates a second output to control the first transistor.

12. A method for producing a stable frequency output by a self-adjusting clock generator, comprising:

producing a frequency output;

converting the frequency output into a voltage output by a frequency to voltage converter inside the self-adjusting clock generator, the frequency to voltage converter including:

a current supply circuit for supplying current;

a current control transistor for controllably passing the current from the current supply circuit according to the frequency output;

a first capacitor and a second capacitor;

a first transistor coupled to the first capacitor in parallel;

a second transistor coupled between the first capacitor and the second capacitor;

a clock cycle divider circuit for dividing the frequency output into three intervals defined by interval one, interval two, and interval three;

wherein the first capacitor is charged during the interval one; the second capacitor is charged by the first capacitor through the second transistor during the interval two; the first capacitor is completely discharged to ground through the first transistor while the current control transistor is off during the interval three;

comparing the voltage output with a reference voltage to generate a comparison voltage denoting drifted frequency of the frequency output;

adjusting frequency of the frequency output in accordance with the comparison voltage; and repeating the converting, the comparing, and the adjusting until the frequency output is converged into the stable frequency output.

13. The method for producing a stable frequency output by a self-adjusting clock generator as recited in claim 12, wherein the frequency output is generated by a voltage control oscillator inside the self-adjusting clock generator.

14. The method for producing a stable frequency output by a self-adjusting clock generator as recited in claim 13, wherein the comparison voltage is provided as feedback to the voltage control oscillator inside the self-adjusting clock generator.

15. The method for producing a stable frequency output by a self-adjusting clock generator as recited in claim 13, wherein the voltage control oscillator is a coarse voltage control oscillator.

16. The method for producing a stable frequency output by a self-adjusting clock generator as recited in claim 12, wherein the reference voltage is generated by a bandgap reference circuit inside the self-adjusting clock generator.

17. The method for producing a stable frequency output by a self-adjusting clock generator as recited in claim 12, wherein voltage output is compared with the reference voltage by a high gain comparator inside the self-adjusting clock generator.

18. The method for producing a stable frequency output by a self-adjusting clock generator as recited in claim 12, wherein the stable frequency output generated by the self-adjusting clock generator varies less than about 3%.

19. The method for producing a stable frequency output by a self-adjusting clock generator as recited in claim 12, wherein the clock cycle divider circuit comprises:

a plurality of first inverters for generating a first signal that has a non-inverted phase and a first delay corresponding to the frequency output;

a plurality of second inverters for generating a second signal that has an inverted phase and a second delay greater than the first delay corresponding to the frequency output;

at least one third inverter for generating a third signal that has a non-inverted phase and a third delay greater than the second delay corresponding to the frequency output;

a plurality of fourth inverters for generating a fourth signal that has an inverted phase and a fourth delay greater than the third delay corresponding to the frequency output;

a first AND logic circuit which receives the first signal and the second signal, and generates a first output to control the second transistor; and a second AND logic circuit which receives the third signal and the fourth signal, and generates a second output to control the first transistor.

* * * * *